United States Patent
Hu et al.

(10) Patent No.: US 12,482,683 B2
(45) Date of Patent: Nov. 25, 2025

(54) CARRIER BOAT FOR DIE PACKAGE FLUX CLEANING

(71) Applicants: ADVANCED MICRO DEVICES, INC., Santa Clara, CA (US); ATI TECHNOLOGIES ULC, Markham (CA)

(72) Inventors: Suming Hu, Santa Clara, CA (US); Farshad Ghahghahi, Santa Clara, CA (US); Andrew Kwan Wai Leung, Markham (CA)

(73) Assignees: ADVANCED MICRO DEVICES, INC., Santa Clara, CA (US); ATI TECHNOLOGIES ULC, Markham (CA)

( * ) Notice: Subject to any disclaimer, the term of this patent is extended or adjusted under 35 U.S.C. 154(b) by 643 days.

(21) Appl. No.: 17/489,286

(22) Filed: Sep. 29, 2021

(65) Prior Publication Data

US 2023/0101770 A1    Mar. 30, 2023

(51) Int. Cl.
*H01L 21/673* (2006.01)
*B23K 1/20* (2006.01)
*H01L 21/02* (2006.01)
*H01L 21/67* (2006.01)

(52) U.S. Cl.
CPC .. *H01L 21/67313* (2013.01); *H01L 21/02052* (2013.01); *H01L 21/02082* (2013.01); *H01L 21/67017* (2013.01); *B23K 1/206* (2013.01)

(58) Field of Classification Search
CPC .......................... H02L 21/67333; B23K 1/206
See application file for complete search history.

(56) References Cited

U.S. PATENT DOCUMENTS

| | | | | |
|---|---|---|---|---|
| 5,278,447 | A * | 1/1994 | Vongfuangfoo | H01L 23/562 257/727 |
| 5,606,793 | A * | 3/1997 | Gross | H01L 21/67121 29/760 |
| 9,633,874 | B1 * | 4/2017 | Lim | H01L 21/67092 |
| 2011/0192761 | A1 * | 8/2011 | JS Hsiao | H01L 21/67051 134/137 |
| 2020/0075371 | A1 * | 3/2020 | Kuo | H01L 21/02057 |
| 2021/0202272 | A1 * | 7/2021 | Taddei | H01L 21/67051 |
| 2022/0302086 | A1 * | 9/2022 | Chang | H01L 24/81 |

FOREIGN PATENT DOCUMENTS

| | | | | |
|---|---|---|---|---|
| JP | 2012199458 A | * | 10/2012 | H01L 21/52 |
| KR | 20200072994 A | * | 6/2020 | H01L 21/67034 |

OTHER PUBLICATIONS

JP-2012199458-A Machine Translation (Year: 2012).*
KR-2020072994-A Machine Translation (Year: 2020).*

* cited by examiner

*Primary Examiner* — Spencer E. Bell

(57) ABSTRACT

A carrier boat for die package flux cleaning, including: a body having at least one pair of substantially parallel sides, the body comprising one or more die package receptacles each oriented at a non-parallel angle relative to the substantially parallel sides of the body such that, when a die package is seated in a die package receptacle of the one or more die package receptacles, a first pair of opposing sides of a die of the die package are substantially perpendicular to the substantially parallel sides.

20 Claims, 5 Drawing Sheets

CARRIER BOAT FOR DIE PACKAGE FLUX CLEANING

BACKGROUND

Flux cleaning is a process by which solder debris and residue (e.g., "flux") is cleaned from solder-coupled components, such as a die coupled to a substrate. One approach to flux cleaning uses fluid propelled from a nozzle directed at the coupled components. Due to the high pressure of the fluid flow used in flux cleaning, the die packages should be held in a stationary position to prevent unwanted movement and to ensure proper fluid exposure. To do so, the die packages are placed in a carrier boat.

DETAILED DESCRIPTION

Flux cleaning is a process by which solder debris and residue (e.g., "flux") is cleaned from solder-coupled components, such as a die coupled to a substrate. One approach to flux cleaning uses fluid (e.g. deionized water, or deionized water with solvents) propelled from a nozzle directed at the coupled components. For larger scale manufacturing where many die-substrate pairs must be cleaned, the substrates and their bonded dies, hereinafter referred to as die packages, are placed on a conveyor belt and directed towards stationary nozzles. The flux is then cleaned when the die packages pass through the stream of the stationary nozzles.

Figure 1:
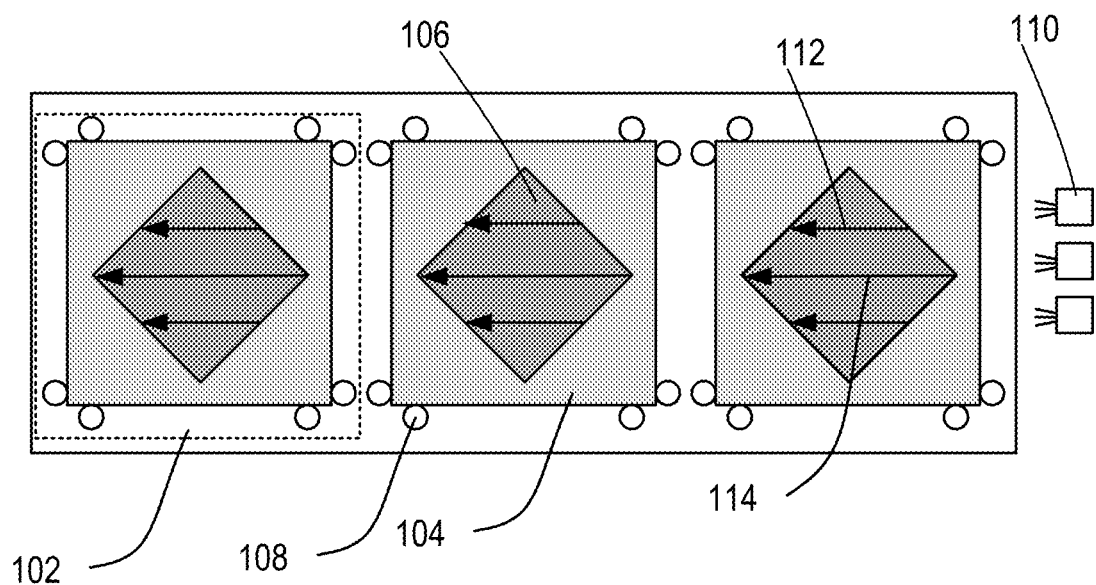
FIG. 1 is an overhead view of an example carrier boat according to some existing solutions.

Due to the high pressure of the fluid flow used in flux cleaning, the die packages should be held in a stationary position to prevent unwanted movement and to ensure proper fluid exposure. To do so, the die packages are placed in a carrier boat. A carrier boat is a device into which multiple die packages are placed. Each die package receptacle holds a die package in a fixed position. As the carrier boat passes through the fluid flow of nozzles (e.g., as the carrier boat travels along a conveyor belt under the flow of stationary nozzles) the seated die packages are cleaned of flux.

Where the dies are bonded to the substrate at an angled or rotated design, flux cleaning efficiency is reduced due to the varying lengths though which the fluid must pass. As an example, FIG. 1 shows a carrier boat according to some existing implementations. The example carrier boat of FIG. 1 includes three die package receptacles in a single row. One skilled in the art will appreciate that other arrangements and layouts of die package receptacles are also contemplated within this discussion of FIG. 1.

The carrier boat of FIG. 1 includes a body with multiple due package receptacles 102 each housing a die package including a substrate 104 and die 106 bonded to the substrate 104 using a solder connection. In some implementations, the die 106 is directly soldered to conductive components or traces in the substrate 104. In the example carrier boat of FIG. 1, each die package is held in place by pins 108 to prevent movement of the die packages when exposed to water from nozzles 110.

As shown in FIG. 1, the dies 106 are bonded at an angle relative to the substrate 104. That is, the sides of the dies 106 are not parallel to the sides of the substrate 104. Accordingly, as each die package is exposed to fluid from the nozzles, the distance that the fluid will travel under or over the die 106 will differ. As an example, arrow 112 shows a shorter distance of fluid travel for a die 106. In contrast, arrow 114 shows a longer distance of fluid travel as the fluid will be traveling from corner to corner. Due to the varying distances in fluid travel, the amount of flux cleaned from the die package will differ. As an example, less flux will be cleaned by fluid that has to travel a longer distance over or under the die 106, such as that shown by arrow 114.

To that end, the present specification sets forth various implementations of a carrier boat for die package flux cleaning. In some implementations, a carrier boat for die package flux cleaning includes: a body having at least one pair of substantially parallel sides, the body including one or more die package receptacles each oriented at a non-parallel angle relative to the substantially parallel sides of the body such that, when a die package is seated in a die package receptacle of the one or more die package receptacles, a first pair of opposing sides of a die of the die package are substantially perpendicular to the substantially parallel sides.

In some implementations, a second pair of opposing sides of the die are substantially parallel to the substantially parallel sides when the die package is seated in the die package receptacle. In some implementations, the one or more die package receptacles are each defined by a recessed portion of the body. In some implementations, the one or more die package receptacles are each defined by a plurality of pins. In some implementations, the carrier boat further includes a lid portion including one or more openings each aligned to a corresponding die package receptacle. In some implementations, the one or more openings each include one or more tabs to restrict movement of a seated die package. In some implementations, the non-parallel angle is approximately forty-five degrees.

The present specification also describes various implementations for a method for die package flux cleaning. Such a method includes: seating one or more die packages in one or more die package receptacles of a carrier boat, wherein the one or more die package receptacles are each oriented at a non-parallel angle relative to a pair of substantially parallel sides of the carrier boat and each die of the one or more die packages is oriented at the non-parallel angle relative to a corresponding substrate of the one or more die packages; and flushing each die package in the carrier boat using one or more fluid nozzles.

In some implementations, the non-parallel angle is approximately forty-five degrees. In some implementations, flushing each die package includes conveying the carrier boat towards one or more stationary fluid nozzles. In some implementations, the one or more die package receptacles are each defined by a recessed portion of a body of the carrier boat. In some implementations, the one or more die package receptacles are each defined by a plurality of pins.

In some implementations, each fluid nozzle is oriented at an angle perpendicular to a side of each die of the one or more die packages.

Also described in this specification are various implementations of a system for die package flux cleaning using a carrier boat. Such a system includes: a carrier boat including a plurality of die package receptacles each oriented at a non-parallel angle relative to a pair of substantially parallel sides of the carrier boat; a plurality of die packages each seated in a die package receptacle of the die package receptacles, wherein each die package includes a substrate and a die oriented at the non-parallel angle relative to the substrate; and one or more fluid nozzles each angled substantially perpendicular to the die of each die package.

In some implementations, the system includes a conveyor belt for directing the carrier boat through a flow of the one or more fluid nozzles. In some implementations, the one or more die package receptacles are each defined by a recessed portion of a body of the carrier boat. In some implementations, the one or more die package receptacles are each defined by a plurality of pins. In some implementations, the carrier boat further includes a lid portion including one or more openings each aligned to a corresponding die package receptacle. In some implementations, the one or more openings each include one or more tabs to restrict movement of a seated die package. In some implementations, the non-parallel angle is approximately 45 degrees.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes implementations in which the first and second features are formed in direct contact, and also includes implementations in which additional features are formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms in this disclosure are intended to encompass different orientations of the device in use or operation in addition to the orientation depicted in the figures.

Figure 2:
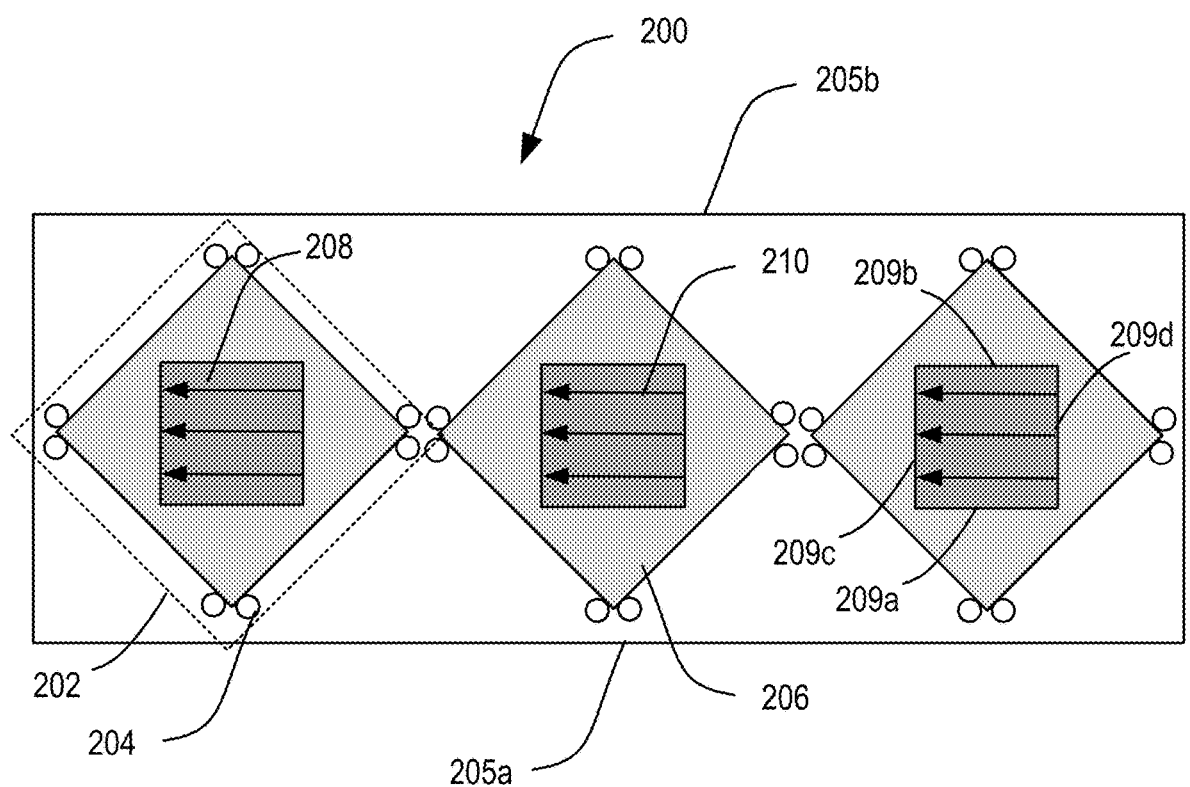
FIG. 2 is an overhead view of an example carrier boat for die package flux cleaning according to some implementations of the present disclosure.

FIG. 2 shows an overhead view of an example carrier boat 200 for die package flux cleaning according to some implementations of the present disclosure. The body of the carrier boat 200 of FIG. 2 includes die package receptacles 202. Although the carrier boat 200 shows three die package receptacles 202 in a single row, one skilled in the art will appreciate that this arrangement of die package receptacles 202 is merely exemplary and for illustrative purposes. Additionally, one skilled in the art will appreciate that other arrangements and layouts of die package receptacles 202 are also contemplated within the scope of the present disclosure. For example, in some implementations, carrier boats 200 will include fewer or additional rows of die package receptacles 202. As another example, in some implementations, carrier boats 200 will include fewer or additional columns of die package receptacles 202.

Each die package receptacle 202 restricts the movement of a die package seated in the die package receptacle 202. In the example carrier boat 200 of FIG. 2, each die package receptacle 202 is defined by multiple pins 204. The pins 204 restrict movement of the die packages relative to the carrier boat 200 in the X/Y plane (e.g., in contrast to the Z axis, which would be towards or away from the viewer in this overhead view). In some implementations, other arrangements of pins 204 using fewer or additional pins 204 are used to achieve similar restrictions of die package movement. One skilled in the art will appreciate that, in some implementations, other approaches for restricting movement of the die packages are used. For example, in some implementations, each die package receptacle 202 is defined by a recess in the body into which the die package is placed. The sides of the recess then serve to restrict the movement of the die package.

As shown, the body of the carrier boat 200 includes parallel opposing sides 205a and 205b. Each die package receptacle 202 is oriented at a non-parallel angle relative to the sides 205a,b of the carrier boat 200. Thus, the sides of substrate 206 of a seated die package are oriented at a non-parallel angle relative to the sides 205a,b of the carrier boat 200. Moreover, opposing sides 209a,b of a die 208 of a seated die package are substantially parallel to the sides 205a,b of the carrier boat 200 and opposing sides 209c,d of the die 208 of the seated die package are substantially perpendicular to the sides 205a,b, of the carrier boat 200.

In this example, the non-parallel angle at which die package receptacles 202 are oriented is forty-five degrees. One skilled in the art will appreciate that the particular non-parallel angle at which die package receptacles 202 are oriented is dependent on the angle at which dies 208 are seated relative to the substrate 206. In other words, the non-parallel angle at which the die package receptacles 202 are oriented is dependent on the angle required to make the sides 209a,b of a die 208 of a seated die package parallel to the sides 205a,b of the carrier boat 200 and the sides 209c,b perpendicular to the sides 205a,b of the carrier boat 200.

As shown by arrows 210, the distance of fluid travel across the dies 208 is substantially the same due to the flux cleaning fluid meeting the side 209d of the die 208 at a perpendicular angle. Thus, flux cleaning inefficiencies caused by varying distances of fluid travel is remedied due to the angular orientation of the die package receptacles 202.

Figure 3:
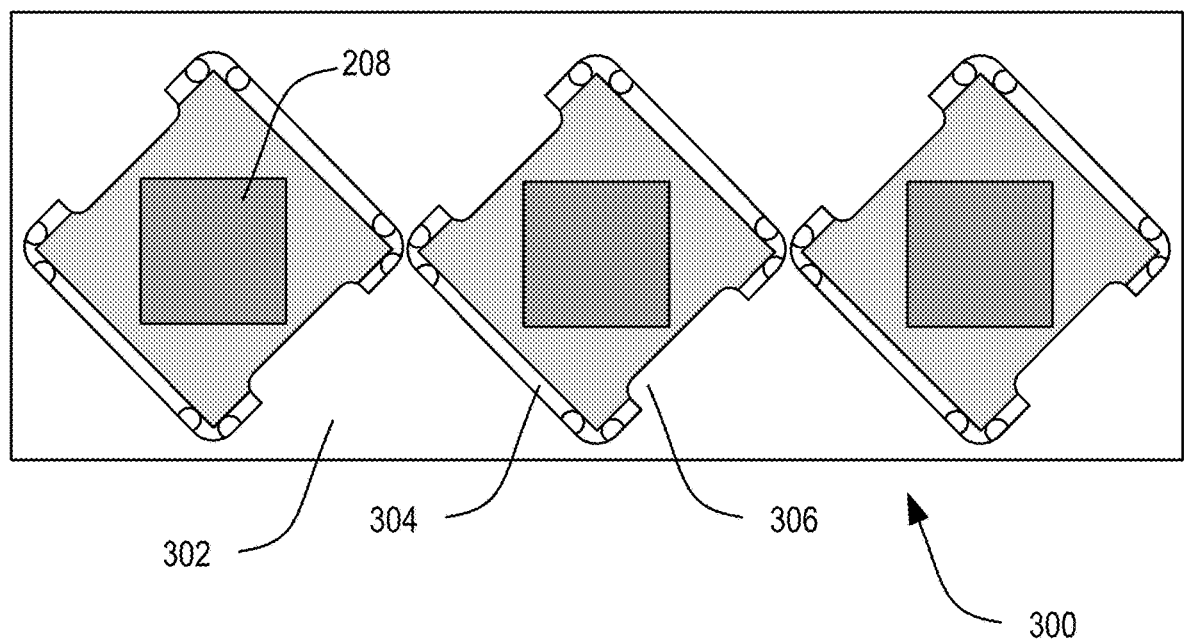
FIG. 3 is an overhead view of an example carrier boat for die package flux cleaning according to some implementations of the present disclosure.

FIG. 3 shows another overhead view of an example carrier boat 300 for die package flux cleaning according to some implementations of the present disclosure. The carrier boat 300 of FIG. 3 is similar to the carrier boat 200 of FIG. 2 but with an additional lid portion 302. In some embodiments, the lid portion 302 is affixed to the body of the carrier boat 300 using hinges, clips, pins, clamps, or other mechanisms as can be appreciated. The lid portion 302 includes openings 304 aligned with each of the die package receptacles 202 to allow fluid access to the dies 208 during flux cleaning. In some implementations, each opening includes one or more tabs 306. The tabs 306 are protrusions from the sides of the openings 304 that restrict movement of a seated die package. As shown, the tabs 306 restrict movement of a die package in the Z-axis (e.g., towards the viewer). Thus, fluid directed to the underside of the die package will not unseat the die package from the carrier boat 300.

Figure 4:
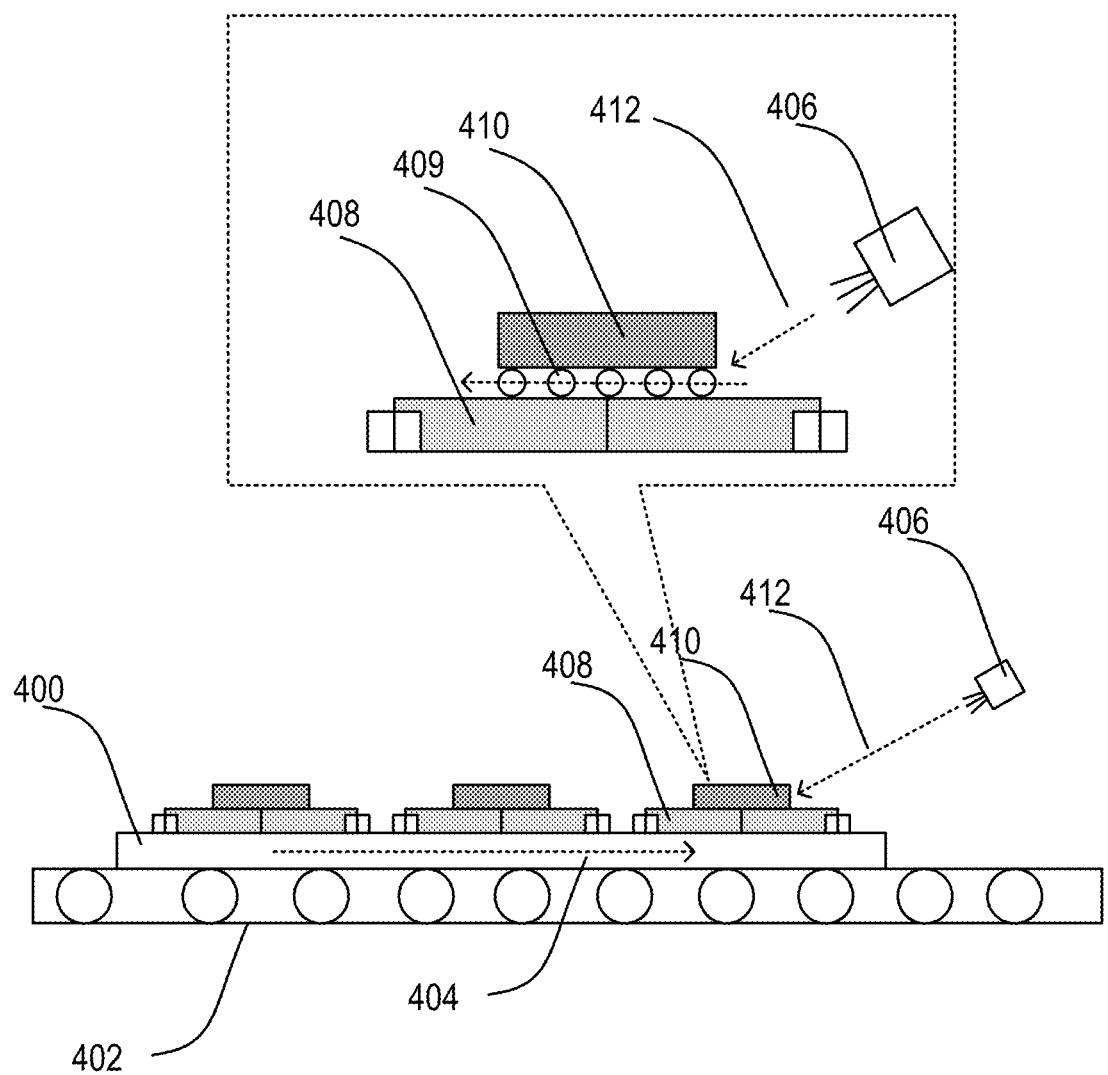
FIG. 4 is a side view of an example flux cleaning system using a carrier boat for die package flux cleaning according to some implementations of the present disclosure.

FIG. 4 shows a side view of a flux cleaning process using a carrier boat according to some implementations of the present disclosure. The example side view includes a carrier boat 400, such as a carrier boat 200 of FIG. 2 or a carrier boat 300 of FIG. 3. Where the carrier boat 400 includes a carrier boat 300 of FIG. 3, the lid portion 302 has been omitted for clarity and illustrative purposes.

As shown, the carrier boat 400 travels along a conveyor belt 402 or other mechanism for conveying the carrier boat 400 in a direction of travel 404 towards one or more nozzles 406. The nozzles 406 in the example of FIG. 4 are stationary while the carrier boat moves toward and under the nozzles. One skilled in the art will appreciate that other layouts and configurations of nozzles 406 are also contemplated within the scope of the present disclosure.

The substrates 408 of the die packages in the carrier boat 400 are seated at an angle such that fluid from the nozzles 406 meet the sides of the dies 410 at a perpendicular angle in the X/Y plane. In other words, the nozzles 406 are angled substantially perpendicular to the sides of the dies 410 in that the X/Y angular components of the nozzles 406 are perpendicular to the dies 410 (e.g., as with an overhead view similar to FIGS. 2-3), while the nozzles 406 are directed at a downward angle in the Z-axis. Thus, fluid 412 from the nozzles 406 meets the dies 410 at a downward angle.

For additional explanation, one die 410 and substrate 408 is depicted in an expanded view. Shown in the expanded view are solder connections 409 between the die 410 and the substrate 408. The solder connections 409 can be formed of a solder bump, as a copper pillar bump with solder, and in other ways. Also shown in the expanded view is the flow of the cleaning fluid as it relates to the solder connections 409.

Figure 5:
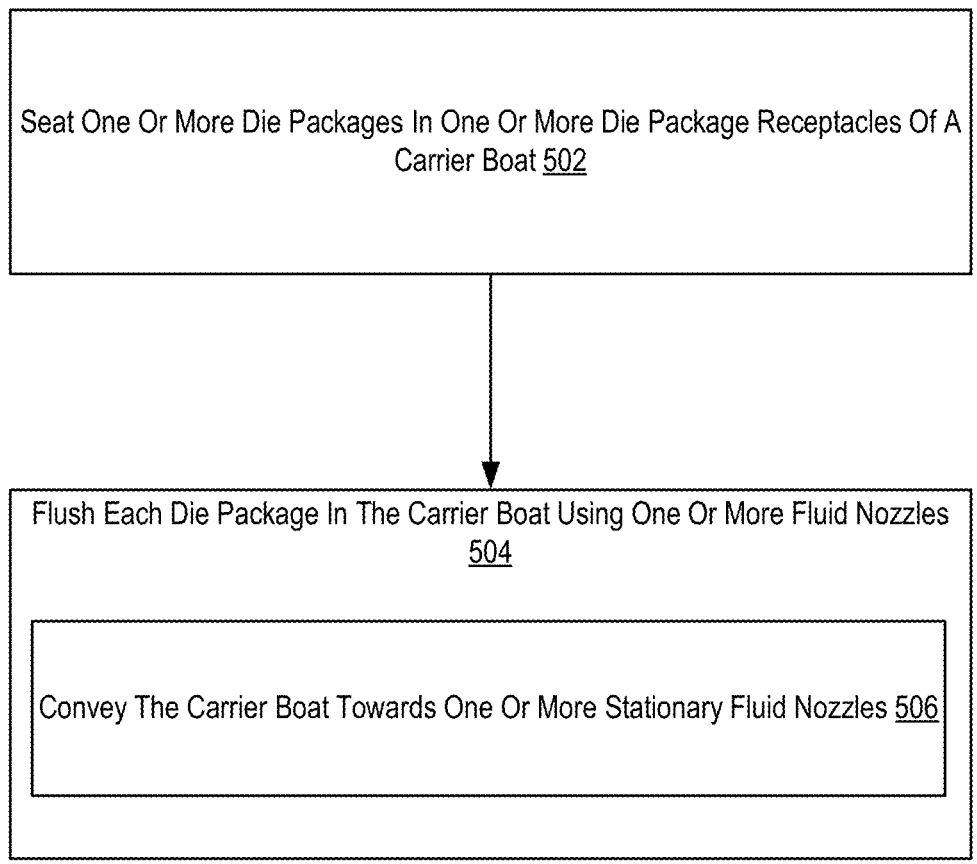
FIG. 5 is a flowchart of an example method for die package flux cleaning according to some implementations of the present disclosure.

For further explanation, FIG. 5 sets forth a flow chart illustrating an example method for die package flux cleaning according to some implementations of the present disclosure. The method of FIG. 5 is implemented, for example, using a system for die package flux cleaning such as that of FIG. 4. The method of FIG. 5 includes seating 502 one or more die packages in one or more die package receptacles 202 of a carrier boat 200. The die package receptacles 202 are each oriented at a non-parallel angle relative to a pair of substantially parallel sides 205a,b of the carrier boat. Each die 208 of a seated die package is oriented at the non-parallel angle relative to a corresponding substrate 206 to which it is bonded. Thus, the sides a substrate 206 of a seated die package are oriented at a non-parallel angle relative to the sides 205a,b of the carrier boat 200. Moreover, opposing sides 209a,b of a die 208 of a seated die package are substantially parallel to the sides 205a,b of the carrier boat 200 and the opposing sides 209c,d of the die 208 of the seated die package are substantially perpendicular to the opposing parallel sides 205a,b, of the carrier boat 200.

Each die package receptacle 202 restricts the movement of a die package seated in the die package receptacle 202. In some implementations, each die package receptacle 202 is defined by multiple pins 204. The pins 204 restrict movement of the die packages relative to the carrier boat 200 in the X/Y plane (e.g., in contrast to the Z axis, which would be towards or away from the viewer in this overhead view). In some implementations, each die package receptacle 202 is defined by a recess in the body into which the die package is placed. The sides of the recess then serve to restrict the movement of the die package. In some implementations, combinations of recesses, pins 204, or other restrictive mechanisms are used in the carrier boat 200 to restrict the movement of die packages.

In some implementations, the non-parallel angle at which die package receptacles 202 are oriented is forty-five degrees. On skilled in the art will appreciate that the particular non-parallel angle at which die package receptacles 202 are oriented is dependent on the angle at which dies 208 are seated relative to the substrate 206. In other words, the non-parallel angle at which the die package receptacles 202 is dependent such that the sides 209a,b of a die 208 of a seated die package are parallel to the sides 205a,b of the carrier boat 200 and the sides 209c,b are perpendicular to the sides 205a,b of the carrier boat 200. One skilled in the art will appreciate that various configurations and layouts of die package receptacles 202 are contemplated within the scope of the present disclosure, including carious numbers of columns or rows of die package receptacles 202 in a given carrier boat 200.

In some implementations, the carrier boat 200 includes a lid portion 302. The lid portion includes openings 304 aligned with each of the die package receptacles 202 to allow fluid access to the dies 208 during flux cleaning. In some implementations, each opening includes one or more tabs 306. The tabs 306 are protrusions from the sides of the openings 304 that restrict movement of a seated die package.

The method of FIG. 5 also includes flushing 504 each die package in the carrier boat 200 using one or more fluid nozzles 406. The fluid nozzles 406 emit a flow of fluid (e.g., water) directed towards a die package such that the fluid flows across and between the die 208 and substrate 206 of the die packages to remove solder debris and residue. In some implementations, the fluid nozzles 406 are directed such that each fluid nozzle 406 is substantially perpendicular to a side of a die 208 (e.g., in the X/Y plane). For example, each nozzle 406 is perpendicular to a side of a die 208 in the X/Y plane and at an angle in the Z-axis.

Each nozzle 406 is perpendicular to a side of the die 208 due to the angled orientation of the die package receptacles 202. Thus, the fluid does not need to flow across the longer distances caused by corner-to-corner fluid flows, increasing the overall amount of flux removed during the flux cleaning process.

In the method of FIG. 5, flushing 504 each die package in the carrier boat 200 using one or more fluid nozzles 406 includes conveying 506 the carrier boat 200 towards one or more stationary fluid nozzles 406. The fluid nozzles 406 are each fixed to provide fluid flow at a particular angle. The carrier boat 200 is then conveyed towards the stationary nozzles 406 using a conveyor belt 402 or another mechanism. Thus, as the carrier boat 200 passes through the fluid streams of the nozzles 406, the seated die packages are flushed. This approach allows for automated flux cleaning for multiple die packages seated in one or more carrier boats 200.

In view of the explanations set forth above, readers will recognize various benefits of a carrier boat for die package flux cleaning. One such benefit, for example, includes improved performance of a computing system by increased effectiveness of flux cleaning for die packages including dies in a rotated orientation relative to their corresponding substrates.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A carrier boat for die package flux cleaning, comprising:
a body having at least one pair of substantially parallel sides, the body comprising one or more die package receptacles each oriented at a non-parallel angle relative to the substantially parallel sides of the body such that, when a die package is seated in a die package receptacle of the one or more die package receptacles, a first pair of opposing sides of a die of the die package are substantially perpendicular to the substantially parallel sides, wherein the body is configured to be directed in an X/Y plane via a conveyor belt through a flow of one or more stationary nozzles in a direction that is at a non-perpendicular angle relative to each side of each die package receptacle, wherein each of the one or more stationary nozzles is angled substantially perpendicular, in the X/Y plane, to the first pair of opposing sides of the die, and wherein each of the one or more stationary nozzles is angled toward the conveyor belt at a downward angle non-perpendicular to the conveyor belt.

2. The carrier boat of claim 1, wherein a second pair of opposing sides of the die are substantially parallel to the substantially parallel sides when the die package is seated in the die package receptacle.

3. The carrier boat of claim 1, wherein the one or more die package receptacles are each defined by a recessed portion of the body.

4. The carrier boat of claim 1, wherein the one or more die package receptacles are each defined by a plurality of pins.

5. The carrier boat of claim 4, wherein the plurality of pins include a plurality of pairs of pins respectively positioned at different corners of each of the receptacles, wherein the plurality of pairs of pins are configured to contact and prevent movement of the one or more die packages relative to the carrier boat.

6. The carrier boat of claim 5, further comprising a lid portion comprising one or more openings each aligned to a corresponding die package receptacle, wherein the one or more openings each include one or more tabs without openings formed therein and respectively aligned to one or more edges of the die package receptacles to restrict movement of a seated die package.

7. The carrier boat of claim 1, further comprising a lid portion comprising one or more openings each aligned to a corresponding die package receptacle.

8. The carrier boat of claim 7, wherein the one or more openings each include one or more tabs without openings formed therein to restrict movement of a seated die package.

9. The carrier boat of claim 8, wherein the one or more tabs comprise protrusions from sides of the one or more openings.

10. The carrier boat of claim 7, wherein the lid portion is affixed to the body.

11. The carrier boat of claim 1, wherein the non-parallel angle is approximately forty-five degrees.

12. A system for die package flux cleaning comprising:
a carrier boat comprising a body having at least one pair of substantially parallel sides, the body including a plurality of die package receptacles each oriented at a non-parallel angle relative to the substantially parallel sides of the body;
a plurality of die packages each seated in a die package receptacle of the die package receptacles, wherein each die package comprises a substrate and a die oriented at the non-parallel angle relative to the substrate, and a first pair of opposing sides of each die are substantially perpendicular to the substantially parallel sides;
one or more stationary fluid nozzles each angled substantially perpendicular, in an X/Y plane, to the first pair of opposing sides of each die of each die package; and
a conveyor belt for directing the carrier boat in the X/Y plane through a flow of the one or more fluid nozzles, wherein the body is configured to be directed via the conveyor belt in a direction that is at a non-perpendicular angle relative to each side of each die package receptacle, and wherein each of the one or more fluid nozzles is angled toward the conveyor belt at a downward angle non-perpendicular to the conveyor belt.

13. The system of claim 12, wherein the one or more die package receptacles are each defined by a recessed portion of the body of the carrier boat.

14. The system of claim 12, wherein the one or more die package receptacles are each defined by a plurality of pins.

15. The system of claim 14, wherein the plurality of pins include a plurality of pairs of pins respectively positioned at different corners of each of the receptacles, wherein the plurality of pairs of pins are configured to contact and prevent movement of the one or more die packages relative to the carrier boat.

16. The system of claim 12, wherein the carrier boat further comprises a lid portion comprising one or more openings each aligned to a corresponding die package receptacle.

17. The system of claim 16, wherein the one or more openings each include one or more tabs without openings formed therein to restrict movement of a seated die package.

18. The system of claim 17, wherein the one or more tabs comprise protrusions from sides of the one or more openings.

19. The system of claim 16, wherein the lid portion is affixed to the body.

20. The system of claim 12, wherein the non-parallel angle is approximately 45 degrees.

* * * * *